(12) United States Patent
Beamish et al.

(10) Patent No.: US 8,693,968 B2
(45) Date of Patent: Apr. 8, 2014

(54) VERY LOW INTERMEDIATE FREQUENCY (VLIF) RECEIVER

(75) Inventors: Norman Beamish, Cork (IE); Michael Milyard, Chandler, AZ (US); Conor O'Keeffe, Cork (IE)

(73) Assignee: Freescale Semiconductor, Inc., Austin, TX (US)

( * ) Notice: Subject to any disclaimer, the term of this patent is extended or adjusted under 35 U.S.C. 154(b) by 865 days.

(21) Appl. No.: 12/523,933

(22) PCT Filed: Jan. 22, 2007

(86) PCT No.: PCT/EP2007/050599
§ 371 (c)(1),
(2), (4) Date: Jan. 25, 2010

(87) PCT Pub. No.: WO2008/089840
PCT Pub. Date: Jul. 31, 2008

(65) Prior Publication Data
US 2010/0173601 A1   Jul. 8, 2010

(51) Int. Cl.
*H04B 17/00* (2006.01)
*H04B 1/06* (2006.01)
*H04B 7/00* (2006.01)
*H04B 1/10* (2006.01)

(52) U.S. Cl.
USPC ............. 455/226.1; 455/226.2; 455/251.1; 455/312

(58) Field of Classification Search
USPC ........... 455/63.1, 67.11, 67.13, 226.1–226.4, 455/245.1, 250.1, 296, 309–312, 317, 323, 455/334, 336–337, 340, 251.1
See application file for complete search history.

(56) References Cited

U.S. PATENT DOCUMENTS

| | | | |
|---|---|---|---|
| 5,157,694 A | 10/1992 | Iwasaki | |
| 5,940,748 A | 8/1999 | Daughtry | |
| 6,577,855 B1 | 6/2003 | Moore et al. | |
| 6,977,976 B1 * | 12/2005 | Birkett et al. | 375/345 |
| 7,072,632 B2 * | 7/2006 | Astrachan et al. | 455/226.2 |
| 7,602,861 B2 * | 10/2009 | Wong et al. | 375/319 |
| 7,706,769 B2 * | 4/2010 | Perkins | 455/295 |
| 7,773,965 B1 * | 8/2010 | Van Brunt et al. | 455/226.1 |
| 2004/0201508 A1 * | 10/2004 | Krone et al. | 341/143 |
| 2005/0143038 A1 * | 6/2005 | Lafleur | 455/296 |
| 2005/0215219 A1 * | 9/2005 | Khorram | 455/226.1 |
| 2006/0141974 A1 | 6/2006 | Campbell | |

* cited by examiner

*Primary Examiner* — Simon Nguyen

(57) ABSTRACT

A very low intermediate frequency (VLIF) receiver comprising a first and second mixer circuits, characterised in that receiver comprises a means of estimating the energy in a desired signal band; a means of estimating the energy in a band of frequencies comprising the desired signal band; and a means of altering a VLIF of the receiver according to the ratio of the energy in a desired signal band and the energy in the band of frequencies comprising the desired signal band.

18 Claims, 5 Drawing Sheets

VERY LOW INTERMEDIATE FREQUENCY (VLIF) RECEIVER

FIELD OF THE INVENTION

The invention relates to a radio receiver and, in particular, a very low intermediate frequency (VLIF) receiver.

BACKGROUND OF THE INVENTION

Today's consumers are demanding increased functionality of wireless transceivers whilst simultaneously requiring a reduction in transceiver size and cost. To cope with these conflicting demands, most of the current generation of wireless transceivers use one of two receiver architectures, namely the direct conversion (or zero intermediate frequency [ZIF]) architecture and the very low intermediate frequency (VLIF) architecture. However, both of these architectures suffer from problems associated with DC offset signals and I/O imbalance.

Typically the incoming signal to a wireless transceiver will consist of a desired signal and a host of other signals which will be classed as undesired signals or interference. The desired signal will occupy a range of frequencies which is typically known as either the desired signal band or channel. In this context the two terms are interchangeable. Channel is more likely to be used when referring to the frequency range of the desired signal when it is transmitted, as this is strictly specified by standard. In contrast, at the receiver, desired signal band is more likely to be used, as the primary metric here is bit error rate. Furthermore, the receiver can define its own desired signal band, as long as the receiver meets performance requirements.

U.S. Pat. No. 6,577,855 describes a method of inverting the sign bit of a VLIF in response to receiver signal characteristics such as bit error rate (BER). However, the scheme described in U.S. Pat. No. 6,577,855 merely swaps image bands to reduce blocker interference and does not balance the contribution of all sources of impairment. In other words, the prior art adjusts the sign of the VLIF in response to a performance metric but does not consider the effect of other sources of impairment that are impacted by the choice of the VLIF. In particular, the prior art neither considers the impact of a DC offset generated by the receiver itself, nor the effect of the circuitry required to remove the offset

SUMMARY OF THE INVENTION

The present invention relates to a very low intermediate frequency (VLIF) receiver as provided in the accompanying claims.

BRIEF DESCRIPTION OF THE DRAWINGS

An embodiment of the invention is herein described, by way of example only, which reference to the accompanying figures, in which.

DETAILED DESCRIPTION OF THE PREFERRED EMBODIMENTS

1. Overview of the Zero Intermediate Frequency (ZIF) Receiver

Figure 1:
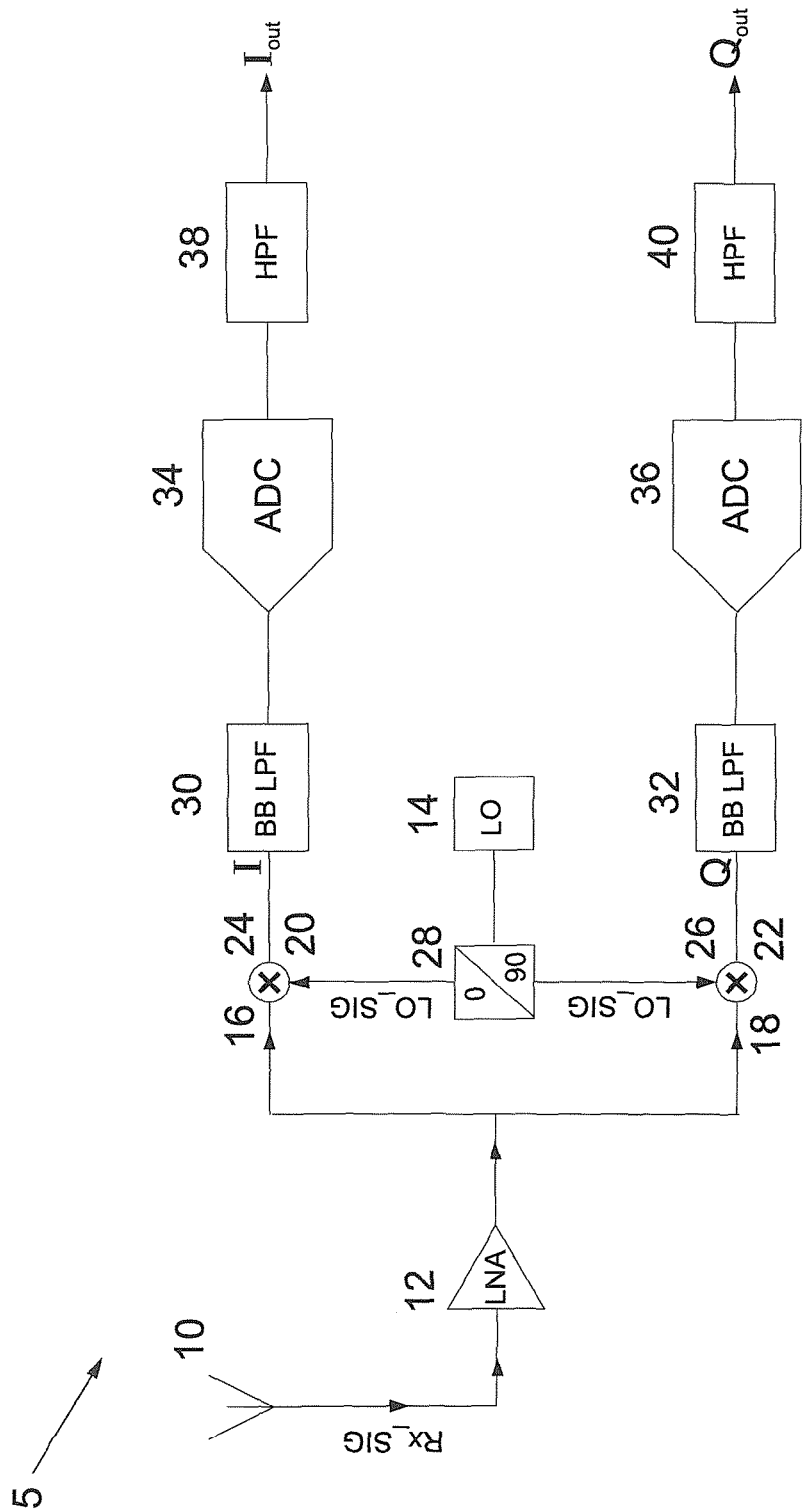
FIG. 1 is a block diagram of a prior art zero intermediate frequency (ZIF) receiver.

Referring to FIG. 1, a zero intermediate frequency (ZIF) receiver 5 comprises an antenna 10 connected to a low noise amplifier (LNA) 12. The ZIF receiver 5 further comprises a local oscillator (LO) 14 and two mixer circuits 16, 18. Each mixer circuit 16, 18 is provided with an RF port 20, 22 and an LO port 24, 26, wherein the RF ports 20, 22 are connected to the LNA 12 and the LO ports 24, 26 are connected to a local oscillator (LO) 14.

In use, the LO 14 transmits an LO signal (LO_SIG) to the mixer circuits 16, 18 through a phase shifter 28, which shifts the phase of the LO signal (LO_SIG) received by one of the mixer circuits 16, 18 by 90° compared with the LO signal (LO_SIG) received by the other mixer circuit 16, 18. Similarly, the antenna 10 receives an incoming signal (Rx_SIG) which is amplified by the LNA 12. The amplified incoming signal (Rx_SIG) is transmitted through the RF ports 20, 22 to the mixer circuits 16, 18, wherein the amplified incoming signal (Rx_SIG) is mixed with the LO signal (LO_SIG). The mixing process down-converts the incoming signal (Rx_SIG) into separate baseband in-phase (I) and quadrature phase (Q) components, wherein the output from each mixer circuit 16, 18 comprises a baseband difference signal and a sum signal (with a frequency twice that of the LO signal (LO_SIG)). The sum signal is attenuated by a low pass filter (LPF) 30, 32 connected to the output of each mixer circuit 16, 18 and the remaining difference signal is converted into the digital domain by baseband analogue to digital converters (ADC) 34, 36. The resulting digital signal is filtered by high pass filters (HPF) 38, 40 which remove a DC offset signal and low frequency noise to produce output signals $I_{out}$ and $Q_{out}$. For simplicity, the path of an I component through its associated LPF 30, ADC 34 and HPF 38 to produce the $I_{out}$ signal, will be known henceforth as an "I path". Similarly, the path of a Q component through its associated LPF 32, ADC 36 and HPF 40 to produce the $Q_{out}$ signal, will be known henceforth as a "Q path"

2. Sources of Interference in a Zero Intermediate Frequency (ZIF) Receiver 2.1 DC Offset DC offset signals are offset voltages that exist at the baseband frequency. However, since the mixer circuits 16, 18 directly down-convert an incoming signal (Rx_SIG) to the baseband, a DC offset signal can appear as an interfering signal in the resulting I and Q components. More particularly, a DC offset signal can arise from LO self mixing which occurs because of the finite isolation (resulting from capacitive and substrate coupling) of the LO ports 24, 26 and the RF ports 20, 22 of the mixer circuits 16, 18. The finite isolation of these ports enables some of the LO signal (LO_SIG) to leak through the RF ports 20, 22 (towards the LNA 12), whereupon the leaked LO signal (LO_SIG) is reflected (because of interface mismatch) back into the mixer circuits 16, 18 and mixed with the original LO signal (LO_SIG) to produce a DC offset signal. Similarly, a time-varying DC offset signal is generated if the leaked LO signal (LO_SIG) is radiated by the LNA 12 and subsequently reflected from moving objects back to the receiver 5.

2.2 Quadrature Imbalance

The mixer circuits 16, 18 provide quadrature mixing which should, in theory, provide infinite attenuation of the foldover of image band energy into the desired signal band. If quadrature mixing is perfect then there is no image foldover. However, in practice, there is always some imbalance between the I and Q paths of a receiver, mainly because of the finite tolerances of the capacitance and resistance values of its analogue components. Quadrature imbalance corrupts a received signal within a desired channel with a portion of the energy contained within the image band of the desired signal (and is also known as alternate channel foldover).

To date, elaborate circuitry and DSP techniques have been developed to combat these problems. However, these approaches have limited success (e.g. DC cancellation is unable to handle variations in a DC offset signal) and have added to the complexity and cost of ZIF receivers.

3. Overview of the Very Low Intermediate Frequency (VLIF) Receiver

Figure 2:
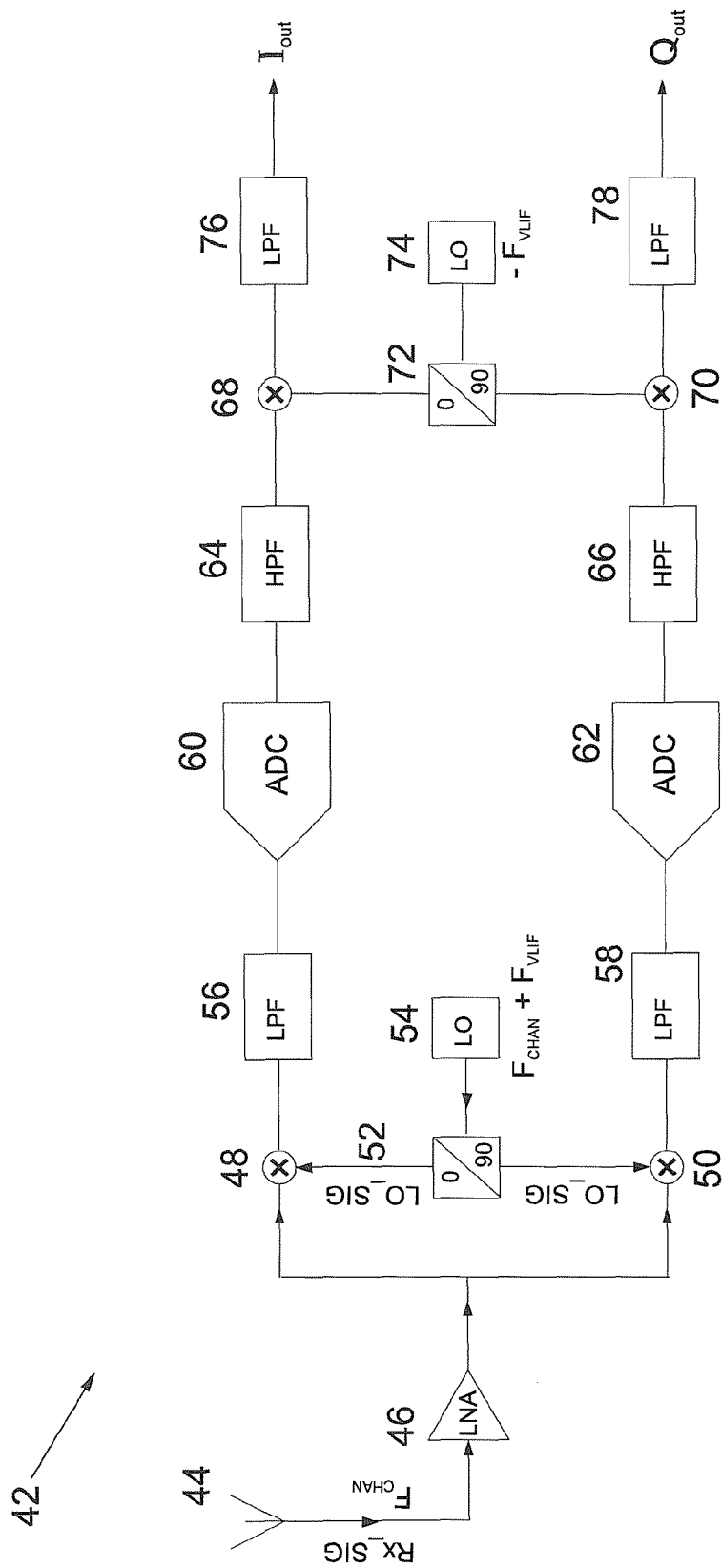
FIG. 2 is a block diagram of a prior art very low intermediate frequency (VLIF) receiver.

The very low intermediate frequency (VLIF) receiver architecture was developed in an effort to circumvent the problems of DC offset signals and 1/f noise whilst preserving the advantages of the ZIF receiver architecture. Referring to FIG. 2, at first glance, a VLIF receiver looks very similar to a ZIF receiver. In particular, a VLIF receiver 42 employs an antenna 44 to receive an incoming signal (Rx_SIG of frequency $f_{CHAN}$) and an LNA 46 to amplify the signal. However, in contrast with the ZIF receiver (which directly down-converts an incoming signal to the baseband), the VLIF receiver 42 down-converts (by mixer circuits 48, 50, phase shifter 52 and an LO 54 operating at a frequency of $f_{CHAN}+f_{VLIF}$) the incoming signal (Rx_SIG) to a frequency very close to, but not equal to, the baseband. In particular, the incoming signal (Rx_SIG) is down-converted to an intermediate frequency (IF) signal (IFRx_SIG) of frequency ($f_{VLIF}$) of approximately 100 kHz. The IF signal (IFRx_SIG) is then filtered by low pass filters 56, 58, converted to the digital domain by analogue to digital converters 60, 62 and high pass filtered by filters 64, 66. The resulting signal is down-converted to the baseband by digital mixing circuits 68, 70, a phase shifter 72 and an LO 74 (operating at the frequency $-f_{VLIF}$). As in the ZIF receiver, the output from each of the mixer circuits 68, 70 comprises a baseband difference signal and a sum signal (with a frequency equal to $2\times f_{VLIF}$), wherein the sum signal is attenuated by a low pass filter (LPF) 76, 78 connected to the output of each mixer circuit 68, 70.

In theory, the main advantage of the VLIF receiver compared to the ZIF receiver is that since the incoming signal (Rx_SIG) is down-converted (by the first mixer circuits 48, 50) to an intermediate frequency, rather than to 0 Hz, a DC offset signal does not overlap with the down-converted incoming signal (IFRx_SIG). Consequently, the DC offset signal can be removed by the high pass filters 64, 66. Nonetheless, in practice, the VLIF receiver architecture still experiences problems with DC offset and quadrature imbalance.

3.1 DC Offset

The high pass filters in a VLIF receiver must pass a down-converted incoming signal (IFRx_SIG) without distortion, whilst removing any DC offset signal and low frequency noise therefrom. However, simulations have shown that when no DC component is present in a down-converted incoming signal (IFRx_SIG), the high pass filters 64, 66 can degrade the performance of a VLIF receiver by more than 2 dB, because the filters remove some of the energy from the down-converted incoming signal (IFRx_SIG) itself. However, this problem can be mitigated by increasing the intermediate frequency ($f_{VLIF}$), so that the high pass filters 64, 66 have less impact on the down-converted incoming signal (IFRx_SIG).

Figure 3:
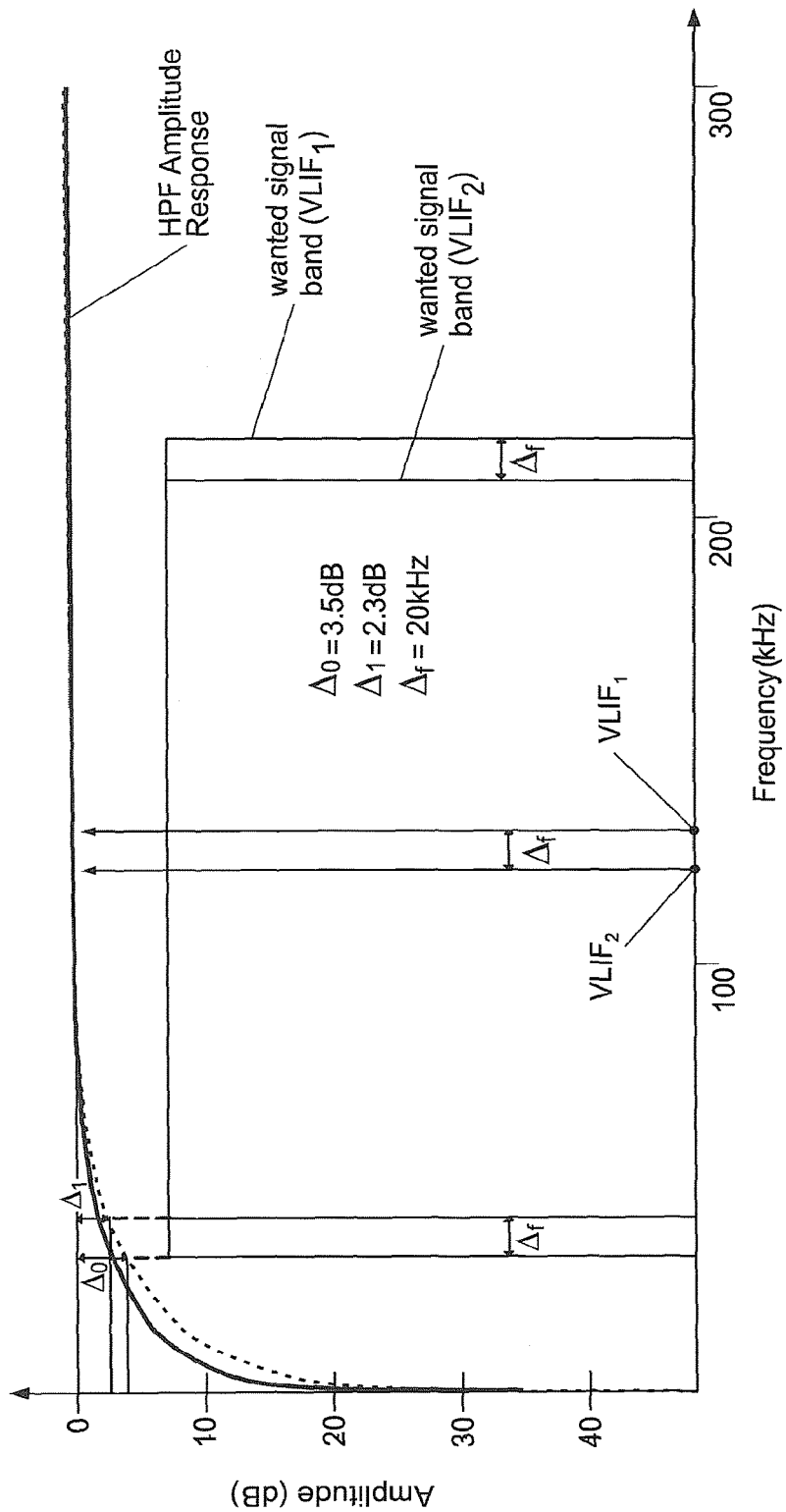
FIG. 3 is a graph of an amplitude-frequency response of the HPF element of the VLIF receiver shown in FIG. 2, with respect to an incoming signal band that has been down-converted to two different intermediate frequencies.

FIG. 3 shows an incoming signal band (of pass band $f_{PB}$) whose central frequency is down-converted to a first intermediate frequency ($f_{VLIF1}$). For simplicity, this signal band will be referred to henceforth as the "first down-converted signal band". The frequencies of the lower and higher band-edges ($E_{11}$, $E_{12}$) of the first down-converted incoming signal band are given by $f_{VLIF1}-f_{PB}$ and $f_{VLIF1}+f_{PB}$ respectively. FIG. 3 also shows the same incoming signal band down-converted to a second intermediate frequency ($f_{VLIF2}$), wherein $f_{VLIF1}<f_{VLIF2}$. For simplicity, this signal band will be referred to henceforth as the "second down-converted signal band". As before, the frequencies of the lower and higher band-edges ($E_{21}$, $E_{22}$) of the second down-converted incoming signal band are given by $f_{VLIF2}-f_{PB}$ and $f_{VLIF2}+f_{PB}$. Superimposed on these first and second down-converted signal bands, is the amplitude-frequency response of a hypothetical high pass filter (with notch N).

Since $f_{VLIF1}<f_{VLIF2}$, the lower band edge ($E_{11}$) of the first down-converted incoming signal band, is closer to the notch (N) of the high pass filter than the lower band edge ($E_{21}$) of the second down-converted incoming signal band. The difference $\Delta_1$ between the plateau amplitude response of the HPF and its amplitude response at lower band-edge frequency ($E_{11}$) of the first down-converted incoming signal band is 3.5 dB. Similarly, the difference $\Delta_2$ between the plateau amplitude response of the HPF and its amplitude response at lower band-edge frequency ($E_{21}$) of the second down-converted incoming signal band is 2.3 dB. Generalising from this, it can be seen that the closer the lower band edge of a down-converted incoming signal (IFRx_SIG) is to 0 Hz, the more the down-converted incoming signal (IFRx_SIG) is attenuated by a high pass filter.

To overcome this problem, the amplitude cutoff response of the high pass filter must be steepened. In the case of a finite impulse response (FIR) filter this approach will rapidly increase the latency of the filter. Similarly, with an infinite impulse response (IIR) filter, both the latency and the non-linearity of the group delay distortion at the high pass filter band edge will increase.

However, in a time division multiple access (TDMA) system such as global system for mobile communications (GSM), there are absolute upper limits on the tolerable latency of a receiver's circuitry. Furthermore, the span of samples that can be combined by an equalizer (e.g. an adaptive filter configured to implement an inverse of a channel frequency response to remove any dispersive filtering effects experienced by a signal between a transmitter and a receiver) in the baseband modem will dictate the acceptable level of group delay distortion. On the other hand, if the intermediate frequency ($f_{VLIF}$) is too large, the down-converted incoming signal (Rx_SIG) will not pass through the low pass filters of the VLIF receiver, without substantial attenuation. Thus, the bandwidth of the VLIF receiver's low pass filters, limits the extent to which the intermediate frequency of a down-converted incoming signal (IFRx_SIG) can be moved away from a DC offset signal.

3.2 Quadrature Imbalance

Reverting to FIG. 2, quadrature imbalance occurs when the operation of the mixer circuits 48, 50 permits energy at the image frequencies to leak into the bandwidth of the incoming signal (Rx_SIG) and to act as an interference therewith. In particular, the performance of a VLIF receiver is very sensitive to blocking signals that are located at an alternate channel (i.e. the negative VLIF). These blocking signals will (with quadrature imbalance) produce images that directly fall within the band of the incoming signal (Rx_SIG). Typically, VLIF receivers will incorporate a quadrature balancing scheme to minimize these images. However, these schemes are not perfect and always leave some residual quadrature imbalance. In a GSM VLIF system where there is a strong adjacent channel interferer to an incoming signal (Rx_SIG), any attempt to increase the intermediate frequency ($f_{VLIF}$) to overcome DC offset will require an improvement in the receiver's quadrature balance. Thus, the above-mentioned limitations on the ability to eliminate quadrature imbalance will also restrict any increases in the intermediate frequency of the VLIF receiver.

In view of the above, the choice of a particular intermediate frequency ($f_{VLIF}$) is driven by a number of conflicting demands including:

increasing $f_{VLIF}$ to facilitate DC offset removal;
minimising $f_{VLIF}$ to minimize the proportion of image energy overlapping with the incoming signal (Rx_SIG) (even with a quadrature balancing scheme, the large blockers that can occur in a GSM system mean that this factor is always significant); and
ensuring that $f_{VLIF}$ is greater than half the bandwidth of the incoming signal (Rx_SIG) (to ensure that any residual DC offset does not fall within the incoming signal (Rx_SIG) band.

4. Present Embodiment

The present embodiment is based on the observation that if little or no interference can be measured in an image band, then quadrature imbalance is unlikely to be a problem in a VLIF receiver, since the amount of energy in the image band that could fold over into a desired signal band would not be large enough to form a dominant source of impairment.

Accordingly, the present embodiment compares the energy in a desired signal band with the energy in a wider band which contains the desired signal band. The result of this comparison indicates whether there is significant energy in the portion of the wider band which is not occupied by the desired signal band. The presence of a significant energy in the unoccupied portion of the wider band can be considered as an indication of the possible presence of energy in the image band. Thus, the VLIF should be set to a low frequency value. Conversely, a failure to detect a significant energy in the unoccupied portion can be used to justify an increase in the VLIF.

Figure 4:
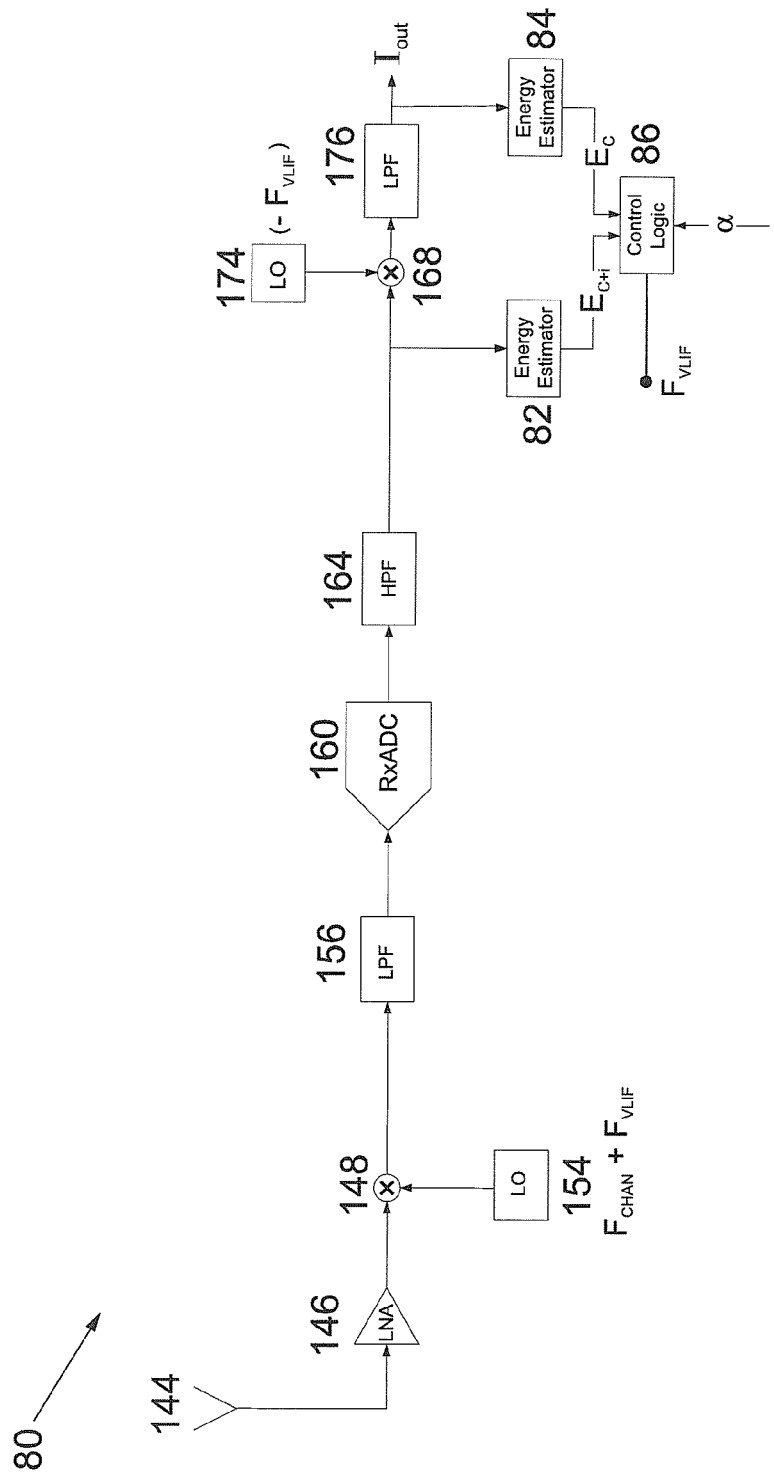
FIG. 4 is a block diagram of a VLIF receiver of the present embodiment.

For simplicity, FIG. 4 only shows the I path of the VLIF receiver of the present embodiment 80. However, it will be appreciated that the Q path of the VLIF receiver of the present embodiment 80 has mirroring features to those depicted in FIG. 4. Thus, the I path of the VLIF receiver of the present embodiment 80 comprises an antenna 144 which receives an incoming signal (Rx_SIG), wherein the incoming signal (Rx_SIG) is processed by a LNA 146 and the resulting signal is downconverted to an intermediate frequency ($f_{VLIF}$) by a mixer circuit 148 and local oscillator 154 (operating at a frequency of $F_{CHAN}+f_{VLIF}$). The resulting intermediate frequency signal is filtered by a low pass filter 156 and converted into the digital domain by an ADC 160. The DC offset signal from the resulting digital signal is removed by a high pass filter 164.

As before, the second stage of the downconversion process is performed by a mixer circuit 168 and a local oscillator 174 (operating at the frequency $-f_{VLIF}$). The resulting baseband signal is processed by a low pass filter 176. In contrast with the prior art VLIF receiver, the I and Q paths of the VLIF receiver of the present embodiment 80 also comprise two energy estimators 82, 84 which operate under the controller of a control logic unit 86.

The first energy estimator 82 is connected between the high pass filter 164 and the mixer circuit 168. Accordingly, the first energy estimator 82 receives a wideband signal including the desired signal and any interference present. Accordingly, the energy ($E_{c+i}$) estimated by the first energy estimator 82 represents the energy of the carrier signal and the interference. The second energy estimator 84 is connected to the output of the low pass filter 176. The low pass filter 168 is designed to pass only the desired signal. Accordingly, the energy ($E_c$) estimated by the second energy estimator 84 represents energy of the desired signal only.

Figure 5:
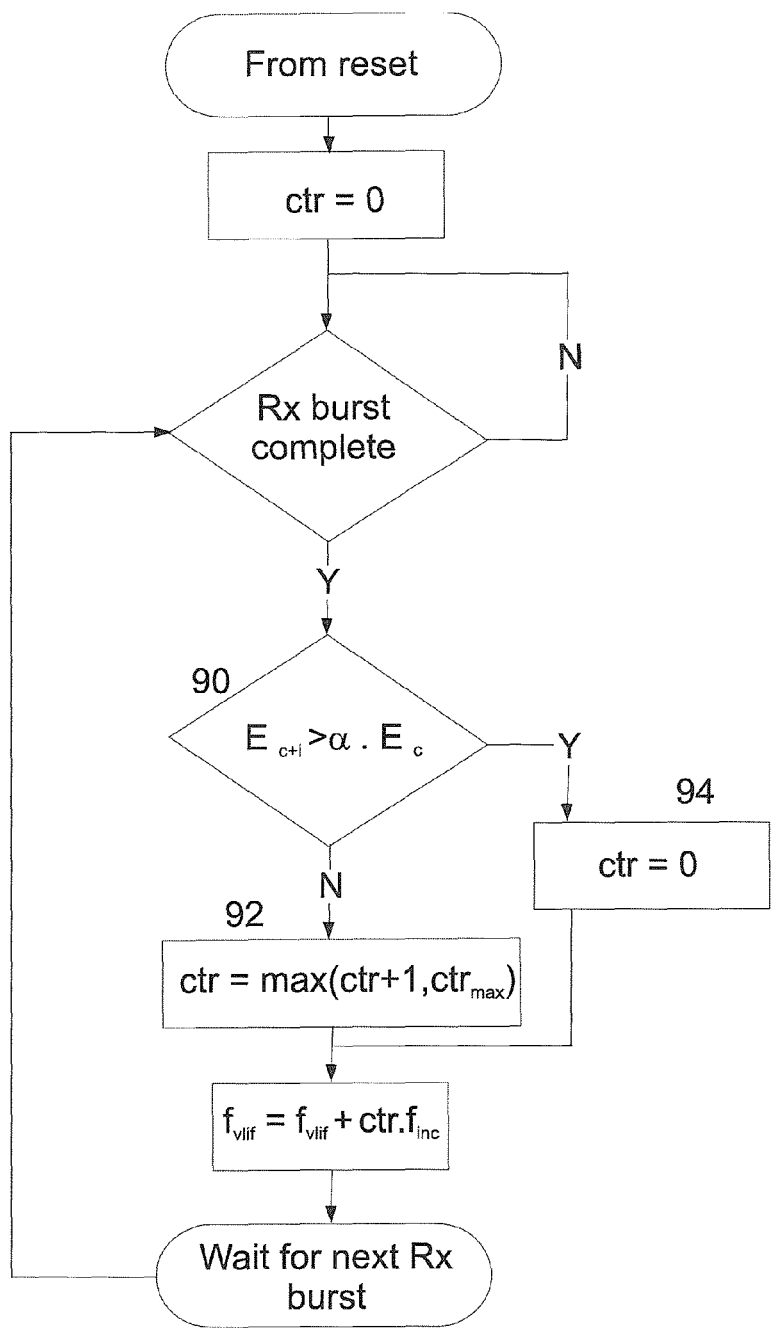
FIG. 5 is a flow chart of the operation of the VLIF receiver of the present embodiment.

Referring to FIG. 5 together with FIG. 4, in use, the control logic unit 86 compares 90 the energy estimates generated by the first energy estimator 82 and the second energy estimator 84 to determine whether or not a strong blocker is present. This allows the ratio of the energy of the carrier signal to the energy of the interferers to be estimated. If $E_{c+i} \approx \alpha E_c$ then the interference is very small. Thus, even if there is signal energy present in the image band, it would not significantly interfere with the desired signal even if the quadrature imbalance is relatively poor. Thus, the intermediate frequency ($f_{VLIF}$) can be increased 92. By increasing the intermediate frequency ($f_{VLIF}$), the separation between a desired signal and any DC offset signal or low frequency noise is increased.

In contrast, if $E_{c+i} \geq \alpha E_c$, then a very large interference is present in the signal. In other words, if the wideband energy is much larger than the desired signal energy, then there is a possibility that there is significant energy in the image band. Thus, there is a possibility of a foldover of some of this energy into the desired signal band). Accordingly, the intermediate frequency ($f_{VLIF}$) is maintained 94 at a low, or default, value. In use, any increase in the intermediate frequency ($F_{VLIF}$) is not applied until the next TDMA slot allocated to the VLIF receiver 80.

The present embodiment provides a mechanism for removing DC offset signals and low frequency noise with minimal impact on a desired signal whilst maintaining acceptable performance in the face of large blockers in the image frequencies. Furthermore, the present embodiment provides a technique for dynamically reconfiguring a VLIF receiver to ensure optimal performance in view of changes in the RF environment observed at its antenna. Finally, the present embodiment provides a control algorithm to dynamically alter an intermediate frequency ($f_{VLIF}$) in search of improved performance in a manner which has not been used before in a GSM/EDGE receiver.

On another note, the energy comparison approach of the present embodiment can be used to track interference energy over a period of time. Similarly, when frequency hopping is active, the present embodiment can be used to track interference energy over different frequencies. In this case, the control logic unit need only keep track of a currently examined channel and keep independent data for each channel used. In other words, like most cellular communication systems, GSM operates over many frequency channels. When a phone initiates communication with a base station it will be dynamically assigned a channel or number of channels to operate on. The assignment of channels will vary over time. The presence or absence of interfering signals will also change over time. Therefore, it is necessary to have a mechanism to keep track of which channels interference is occurring on. For example a GSM phone may be communicating with the base station using two channels that it hops between. If channel A has an associated interferer and channel B does not then it is beneficial to configure the receiver differently for channel than for channel B).

Alterations and modifications may be made to the above without departing from the scope of the invention.

The invention claimed is:

1. A very low intermediate frequency (VLIF) receiver comprising:
    a first and a second mixer circuit;
    a first energy estimator for estimating an energy in a desired signal band;
    a second energy estimator for estimating an energy in a wider band of frequencies, wherein the wider band of frequencies comprises the desired signal band; and
    a controller for altering a VLIF of the receiver according to a ratio of the energy in the desired signal band and the energy in the wider band of frequencies.

2. The very low intermediate frequency (VLIF) receiver as claimed in claim 1, wherein the second energy estimator and the first energy estimator sandwich the second mixer circuit.

3. A method of controlling a very low intermediate frequency of a radio receiver comprising:
    estimating an energy in a desired signal band;
    estimating an energy in a wider band of frequencies, wherein the wider band of frequencies comprises the desired signal band;
    calculating a ratio of the energy in the desired signal band and the energy in the wider band of frequencies; and
    altering the very low intermediate frequency of the receiver according to the ratio.

4. A method as claimed in claim 3, wherein the step of altering the very low intermediate frequency comprises:
    increasing the very low intermediate frequency in the event that the ratio is greater than or equal to a predefined threshold; and
    maintaining the very low intermediate frequency at a default value in the event that the ratio is less than the predefined threshold.

5. The method as claimed in claim 4, wherein the step of generating the estimate of the energy in the band of frequencies comprising:
    the estimating the energy in the wider band of frequencies is performed substantially before a second down-conversion step in the receiver; and
    the estimating the energy in the desired signal band is performed substantially after the second down-conversion step.

6. The method as claimed in claim 4, wherein the step of altering the very low intermediate frequency of the receiver is performed at a next TDMA slot of the receiver.

7. A method of tracking interference energy over a predefined period of time, the method comprising:
    performing the method of claim 4 repeatedly over the predefined period; and
    comparing the energies measured over the period.

8. A method of adapting a VLIF receiver, the method comprising:
    performing the method of claim 4 at each one of a plurality of predefined frequencies;
    comparing the energies measured at each such frequency; and
    configuring the receiver for each such frequency in accordance with the ratio of energies calculated at that frequency.

9. The method of claim 8 being implementable during the normal operation of the receiver.

10. The method as claimed in claim 3, wherein
    the estimating the energy in the wider band of frequencies is performed substantially before a second down-conversion step in the receiver; and
    the estimating the energy in the desired signal band is performed substantially after the second down-conversion step.

11. The method as claimed in claim 10, wherein the step of altering the very low intermediate frequency of the receiver is performed at a next TDMA slot of the receiver.

12. A method of tracking interference energy over a predefined period of time, the method comprising:
    performing the method of claim 10 repeatedly over the predefined period; and
    comparing the energies measured over the period.

13. A method of adapting a VLIF receiver, the method comprising:
    performing the method of claim 10 at each one of a plurality of predefined frequencies;
    comparing the energies measured at each such frequency; and
    configuring the receiver for each such frequency in accordance with the ratio of energies calculated at that frequency.

14. The method of claim 13 being implementable during the normal operation of the receiver.

15. The method as claimed in claim 3, wherein the step of altering the very low intermediate frequency of the receiver is performed at a next TDMA slot of the receiver.

16. A method of tracking interference energy over a predefined period of time, the method comprising:
    performing the method of claim 3 repeatedly over the predefined period; and
    comparing the energies measured over the period.

17. A method of adapting a VLIF receiver, the method comprising:
    performing the method of claim 3 at each one of a plurality of predefined frequencies;
    comparing the energies measured at each such frequency; and
    configuring the receiver for each such frequency in accordance with the ratio calculated at that frequency.

18. The method of claim 17 being implementable during the normal operation of the receiver.

* * * * *